(12) United States Patent
Desai et al.

(10) Patent No.: US 8,511,229 B2
(45) Date of Patent: Aug. 20, 2013

(54) MULTILAYERED MICROCAVITIES AND ACTUATORS INCORPORATING SAME

(76) Inventors: Amish Desai, Altadena, CA (US); Bob Melendes, Pasadena, CA (US); Ming Lu, Arcadia, CA (US); Brian Fuchs, Hackettstown, NJ (US); Stephen Chau, San Gabriel, CA (US)

( * ) Notice: Subject to any disclaimer, the term of this patent is extended or adjusted under 35 U.S.C. 154(b) by 0 days.

(21) Appl. No.: 11/801,358

(22) Filed: May 9, 2007

(65) Prior Publication Data
US 2008/0276819 A1 Nov. 13, 2008

(51) Int. Cl.
*F42C 15/29* (2006.01)
(52) U.S. Cl.
USPC .............. 102/202.5; 102/202.7; 102/202.12; 102/200; 102/205; 102/275.11
(58) Field of Classification Search
USPC ........ 102/202.7, 202.5, 202.8, 202.9, 202.11, 102/200, 205, 275.11, 202.14
See application file for complete search history.

(56) References Cited

U.S. PATENT DOCUMENTS

| | | | | |
|---|---|---|---|---|
| 5,370,054 | A * | 12/1994 | Reams et al. | 102/202.5 |
| 5,969,286 | A * | 10/1999 | Ward et al. | 102/202.7 |
| 6,619,692 | B2 * | 9/2003 | Van Wynsberghe et al. | 280/741 |
| 7,021,217 | B2 * | 4/2006 | Desai et al. | 102/202.5 |
| 7,587,977 | B2 * | 9/2009 | Broyer et al. | 102/202.11 |
| 2007/0095236 | A1 * | 5/2007 | Maruyama et al. | 102/202.9 |

* cited by examiner

*Primary Examiner* — Daniel J Troy

(57) ABSTRACT

A microcavity structure. In an illustrative embodiment, the microcavity structure includes a first substrate, which has a region of interest. A second substrate with a perforation therein is bonded to the first substrate. The perforation coincides with the region of interest. In a specific embodiment, the first substrate is implemented via a Printed Circuit Board (PCB). The region of interest includes one or more circuit components, including an actuator, such as a bridgewire, thereon or therein. A smoothing layer is included between the PCB and the actuator. A bonding gasket adheres the first substrate to the second substrate. The perforation accommodates energetic material that is selectively ignited via the actuator.

6 Claims, 7 Drawing Sheets

MULTILAYERED MICROCAVITIES AND ACTUATORS INCORPORATING SAME

ACKNOWLEDGEMENT OF GOVERNMENT SUPPORT

This invention was made with Government support under Contract No. W15QKN-04-C-1130 awarded by the United States Army. The Government has certain rights to this invention.

BACKGROUND OF THE INVENTION

1. Field of Invention

This invention relates to cavities and accompanying substrates in which the cavities are formed. Specifically, the present invention relates to cavities that are coupled to circuits or other features and further relates to methods for creating such cavities.

2. Description of the Related Art

Cavities are employed in various demanding applications including micro thrusters, airbag initiators, and initiators for munitions. Such applications often demand cost-effective explosive-filled microcavities that can be readily positioned and coupled to a control circuit.

Initiators often include a heating element, such as a bridgewire or reactive bridge, which is adjacent to an energetic material. For the purposes of the present discussion, an energetic material may be any material that may selectively ignite, burn, explode, or otherwise release energy.

When activated via a control circuit, the bridgewire heats and ignites the energetic material. The bridgewire and primary energetic material are often embedded in a physical cap or cavity and then individually positioned on a circuit board or chip via a pick-and-place robot. The bridgewire is then coupled to the accompanying control circuit.

Conventional fabrication schemes often require several serial processes, wherein each device is processed individually, such as via a robotic assembly line. Unfortunately, such manufacturing techniques are often undesirably expensive and inefficient.

Hence, a need exists in the art for a cost-effective and versatile cavity structure and accompanying method for making same.

SUMMARY OF THE INVENTION

Certain embodiments of the present invention implement a microcavity structure. For the purposes of the present discussion, a microcavity structure may be any cavity and accompanying substrate(s) in which the cavity is formed. A cavity, such as a microcavity, may be any opening, indentation, or other aperture in a first material. Hence, a microcavity formed in a first material and filled with a second material is still considered a cavity for the purposes of the present discussion.

In one embodiment, the microcavity structure includes a first substrate, which has one or more desired regions, i.e., regions of interest. A second substrate, which has one or more perforations therein, is bonded to the first substrate. One or more of the perforations coincide with the one or more desired regions.

In a specific embodiment, the first substrate is implemented via a Printed Circuit Board (PCB). The one or more desired regions have one or more circuit components, including an actuator, thereon or therein. In this embodiment, the actuator includes a bridgewire. A smoothing layer is included between the bridgewire and the PCB between electrodes that are coupled to the bridgewire. A bonding gasket adheres the first substrate to the second substrate. The perforations accommodate energetic material that may be detonated by activating the bridgewire.

In a more specific embodiment, thin-film bridgewires are processed directly on a custom pre-processed PCB wafer with conductor traces, vias, through-holes, and electrical pads on the front and backside of the wafer as needed. Energetic-filled perforations in a second PCB wafer are aligned with the thin-film bridgewires, which ignite the explosives in the perforations in response to predetermined electrical signals.

The novel design of certain embodiments of the present invention is facilitated by the use of different substrate layers to create desired circuit features, such as microcavities. Conventionally, expensive and time-consuming processes were employed to etch microcavities in silicon wafers; load the microcavities with explosives and an accompanying bridgewires; dice the wafers into various segments, with each segment having a cavity; robotically place the corresponding segments onto a circuit board; bond the segments to the circuit board, and so on. Certain embodiments of the present invention may be cost-effectively manufactured without such expensive and tedious production steps.

DESCRIPTION OF THE INVENTION

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

For the purposes of the present discussion, an initiator may be any device or module that initiates or starts an action in response to an input signal or sensed condition. A sensor may be any device or module that senses or detects a condition or environmental variable and provides a signal, such a mechanical or electrical signal, in response thereto. Accordingly, an initiator may be a type of sensor, and an initiator may incorporate a sensor, such as to facilitate selectively initiating an action. An igniter may be any actuator that ignites energetic material, such as in response to a signal provided by a sensor or initiator.

An actuator may be any hardware and/or software device and/or module that performs an action, such as generating an electrical signal or initiating explosives, in response to certain input, such as a particular mechanical, electrical, or optical signal. Hence, a sensor, which may produce a signal in response to a sensed condition, is considered a type of actuator, wherein the action performed by the sensor is the generation of the signal.

A signal may be any conveyed information or that which is employed to convey the information. For example, a radio signal may be the information conveyed in a transmitted radio wave, or the signal may be the radio wave itself. Signals are often named after the medium employed to convey information in the signal. Additional examples of signals include chemical, mechanical, optical, electrical, and electrochemical signals. For example, a mechanical action that activates an explosion, the explosion itself, a mechanical signal that causes mixing of battery electrolytes, and so on, are all considered signals for the purposes of the present discussion.

For clarity, various well-known components, such as optional assembly screws, initiator arrays, and so on, have been omitted from the figures. However, those skilled in the art with access to the present teachings will know which components to implement and how to implement them to meet the needs of a given application. Furthermore, the figures are not necessarily drawn to scale.

Figure 1:
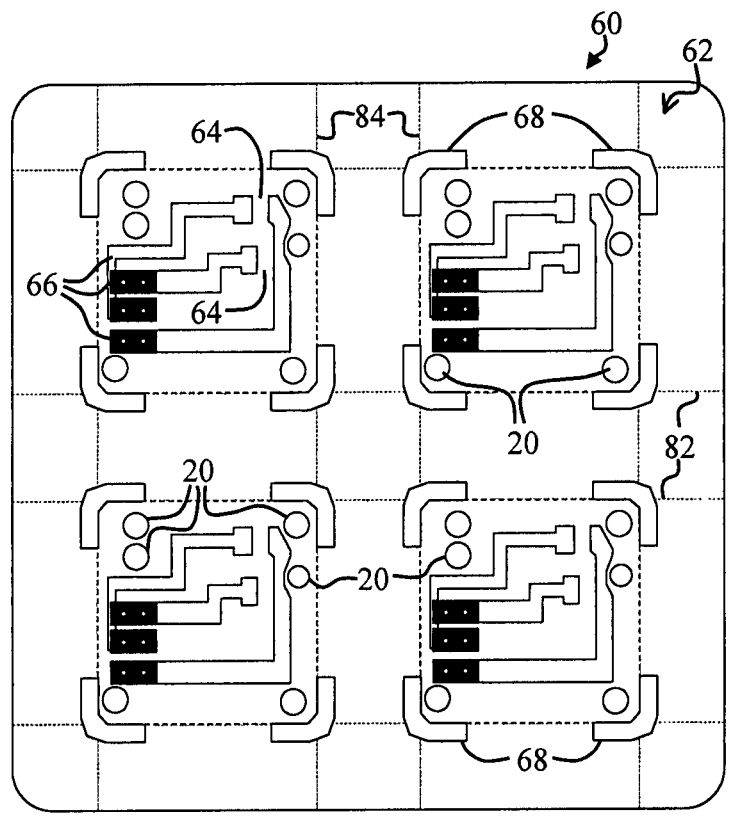
FIG. 1 illustrates a wafer with plural PCB sections that correspond to bottom layers of PCB initiators.

FIG. 1 illustrates a wafer 60 with plural Printed Circuit Board (PCB) sections 62 that correspond to bottom layers of PCB initiators. For the purposes of the present discussion, a PCB initiator may be any initiator employing a cavity formed in a PCB.

A circuit-element cavity may be any cavity with a circuit element positioned therein or coupled thereto. A circuit element may be any component, such as an actuator, of a circuit. Exemplary circuit components include diodes, bridgewires, reactive bridges, and so on. A reactive bridge may be any heating element that is selectively heated or cooled via a chemical reaction in response to a signal, such as an electrical or optical signal. An exemplary reactive bridge is discussed in U.S. Pat. No. 6,925,938 by Baginski, et al., entitled ELECTRO-EXPLOSIVE DEVICE WITH LAMINATE BRIDGE, the teachings of which are hereby incorporated by reference herein.

A PCB may be any board, substrate, or material layer that is adapted to accommodate a circuit. Conventionally, PCBs are often made of one or more layers of insulating material, such as Flame Resistant 4 (FR4), upon which a circuit is disposed or to be disposed, such as via etching techniques. A preprinted PCB may be any layer or substrate having a circuit thereon or therein.

An additional layer with strategically placed holes will be placed on top of the wafer 60 so that the holes coincide with bridgewire locations 64, as discussed more fully below. The bridgewire locations 64 are between electrodes 66. The wafer 60 exhibits plural strategically shaped slots 68, which facilitate creating plural strategically shaped chips (corresponding to the PCB sections 62) when the wafer 60 is cut along horizontal axis 82 and vertical axis 84. To create concave chip features, concave slots may be used as discussed more fully below. Additional holes 20 may act as guide holes for mounting chips and/or viewing holes through which desired objects or processes can be viewed, as discussed more fully below.

PCB-manufacturing techniques according to certain embodiments of the present invention may be extremely cost effective. Costs to perform certain steps, such as routing slots and through-holes, are often prohibitive when using conventional semiconductor substrates.

A PCB-initiator fabrication process implemented according to certain embodiments of the present invention may offer the following advantages:

1) Leverages preexisting low-cost large PCB-manufacturing foundry base.

2) Employs low-cost thermally and electronically insulating high quality substrate with pre-processed holes, metallized vias, traces, and conductive pads for flip chip bonding.

3) Employs layers that may be easily laminated or bonded.

4) Employs 25-micron or larger metallization, which is more readily available than existing thin-film semiconductor processes.

5) Allows adjacent placement of electronic circuitry.

In initiator applications, the required bridgewire width and thickness is often on the order of microns. Thin film lithographic processes may be employed to achieve the required bridge-wire thickness for a given application. Thin-film techniques are particularly useful in cases wherein conventional PCB technology lacks sufficient resolution to achieve desired bridge-wire thickness. One embodiment of the present invention combines PCB, thin-film lithography, and laminating techniques, as discussed more fully below.

PCB-initiator manufacturing techniques and associated versatile and cost-effective initiators are very useful in various applications, including sensitive and insensitive munitions, initiators, and micro-thrusters.

Figure 2:
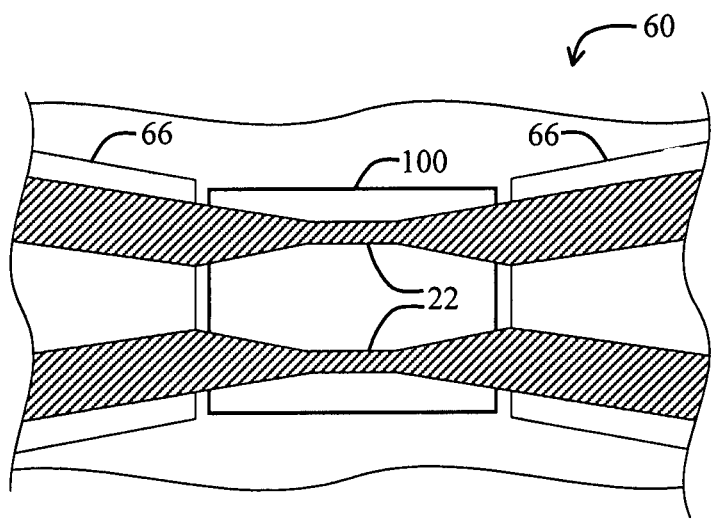
FIG. 2 is a diagram illustrating bridgewires and accompanying metallic electrodes disposed on a PCB substrate.

FIG. 2 is a diagram illustrating bridgewires 22 and accompanying metallic bridgewire electrodes 66, which are disposed on the PCB substrate 60. A bridgewire may be any controllable heating element, such as an electrically controllable heating element. For example, an electrically controllable heating element that selectively heats or explodes in response to a predetermined electrical signal may be considered to be a type of bridgewire. In the present embodiment, the bridgewires 22 are designed to get hot enough to initiate a predetermined amount and type of energetic material in response to a predetermined electrical signal.

The bridgewires 22 may be deposited on the substrate 60 and coupled to the electrodes 66 via thin film processes. In the present specific embodiment, a polymer smoothing layer 100 is positioned between the bridgewires 22 and the substrate 60 between the electrodes 66. For the purposes of the present discussion, a smoothing layer may be any layer of material, such as a polymer material, that is adapted to reduce surface roughness or to otherwise provide a desired consistent texture on the surface of a circuit board or other substrate.

The smoothing layer 100 is spin-coated on the substrate 60 and patterned as needed via lithography so that the smoothing layer only covers desired portions of the substrate 60. In the embodiment of FIG. 2, the desired portion of the substrate 60 corresponds to a region between the bridgewire electrodes 66 over which the bridgewires 22 are deposited. The bridgewire electrodes 66 may be implemented via gold-plated copper traces or via other types of conductors without departing from the scope of the present invention.

The smoothing layer 100 is characterized by a predetermined roughness. The roughness of material under the bridgewires 22 affects the resistance of the bridgewires 22. The resistance of a bridgewire also varies directly with the length and varies inversely with the cross-sectional area, or thickness of the bridgewire. The power output by a bridgewire in response to a signal is a function of the signal and the resistance of the bridgewire. The dimensions and composition of the bridgewires 22 are chosen based on the predetermined roughness of the smoothing layer 100 so that the bridgewires 22 output sufficient energy to ignite accompanying energetic material disposed on or near the bridgewires 22, as discussed more fully below. Use of the smoothing layer 100 may facilitate consistent manufacture of bridgewires, which greatly improves production yield.

In certain applications, the smoothing layer 100 may be extremely smooth, resulting in reduced bridgewire resistance. To compensate, the bridgewires 22 may be made narrower and/or longer. However, in certain applications, extremely thin bridgewires may be insufficient to ignite accompanying energetic material. In such applications, the resistivity of the bridgewires 22 may be adjusted as needed by changing the materials used to create the bridgewires 22. For example, certain embodiments may employ gold alloyed with another metal, i.e., a gold-metal alloy, to achieve desired bridgewire performance characteristics. The exact alloy is application specific. Various bridgewire compositions, shapes, patterns, and dimensions may be employed without departing from the scope of the present invention.

Figure 3:
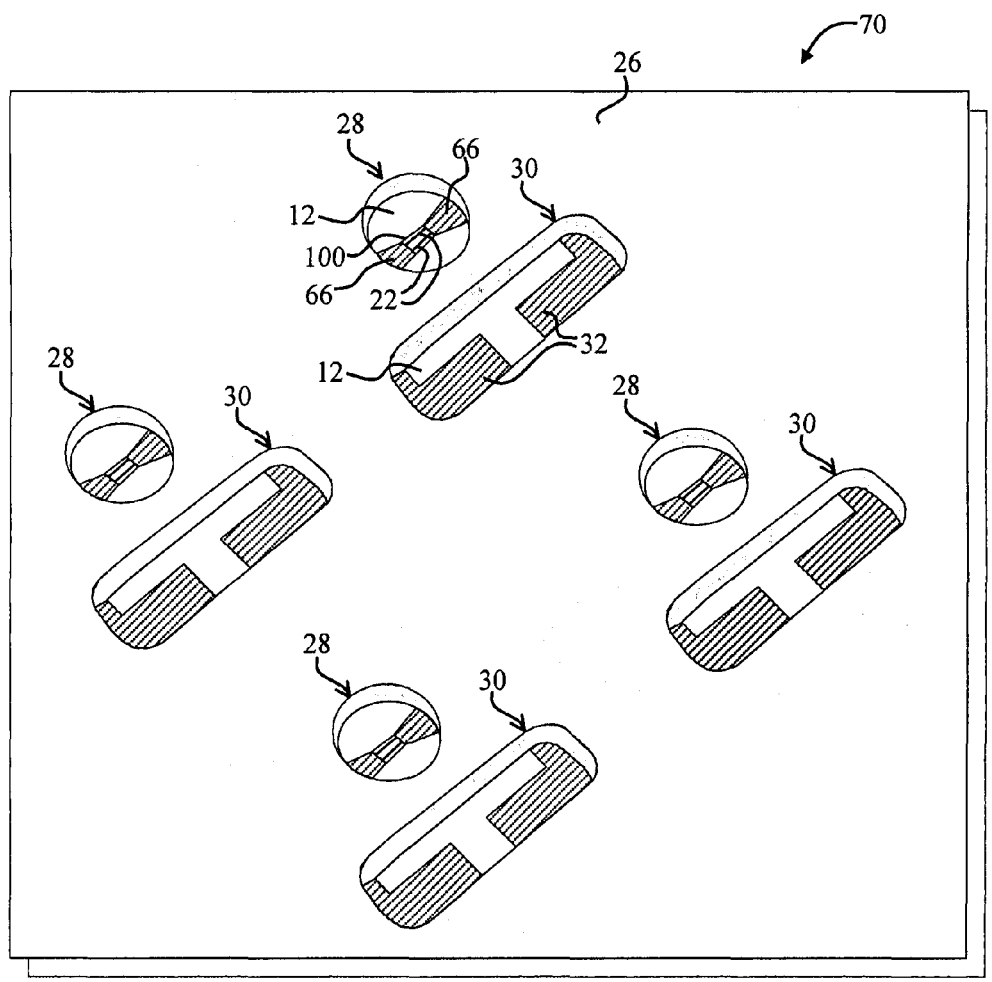
FIG. 3 illustrates an array of microcavities constructed according to an embodiment of the present invention that includes probing cavities, probing electrodes, and initiator cavities.

FIG. 3 illustrates an array 70 of microcavities 28, 30 constructed according to an embodiment of the present invention that includes probing cavities 30, probing electrodes 32, and initiator cavities 28. The initiator cavities 28 include bridgewire electrodes 66 and bridgewires 22. The bridgewires 22 are deposited on the smoothing layers 100. The array 70 is implemented by bonding a top PCB layer 26 to a bottom pre-printed PCB 12 to create the microcavities 28 in which energetic may be deposited and selectively actuated as desired.

The microcavities 28, 30 are said to coincide with desired regions, also called regions of interest, of the underlying substrate. The desired regions have certain features, such as smoothing layers 100, bridgewires 22, and electrodes 32 positioned thereon or therein. For the purposes of the present discussion, a desired region may be any two-dimensional area or three-dimensional space that exhibits one or more characteristics or features thereon or therein, wherein the one or more characteristics or features are useful when incorporated in or adjacent to a cavity.

Figure 4:
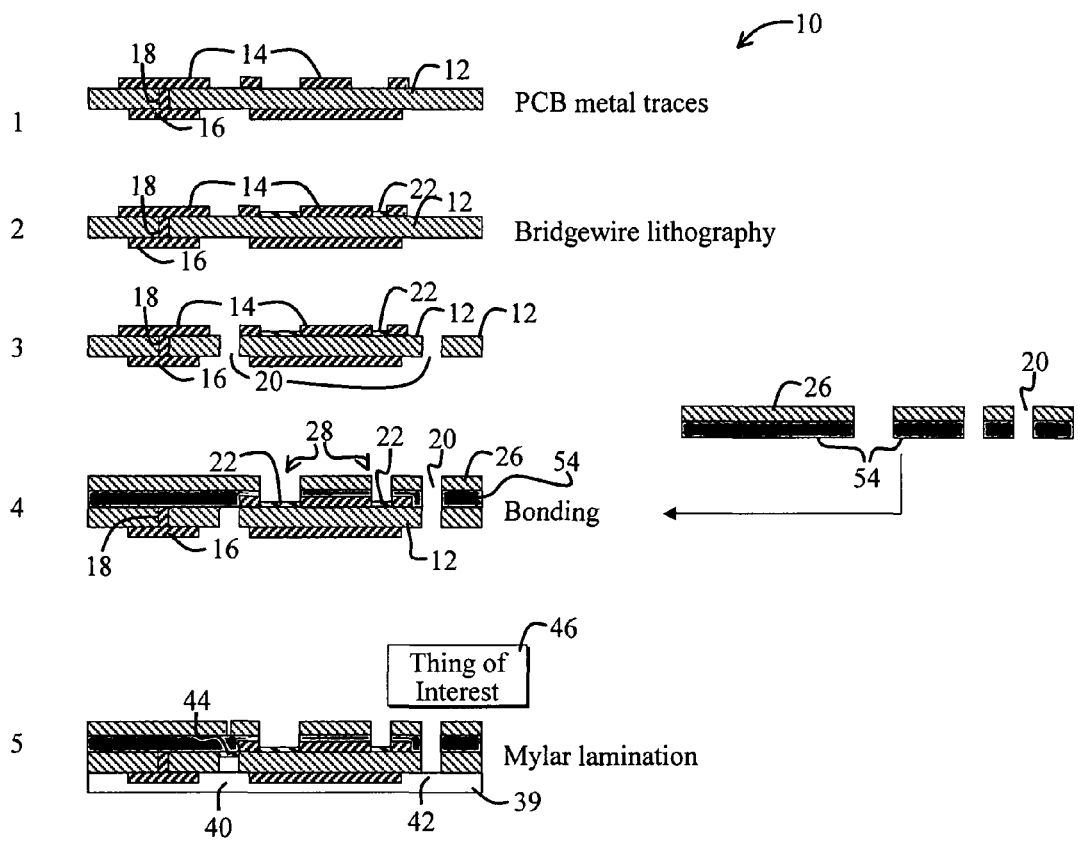
FIG. 4 illustrates exemplary stages of manufacture corresponding to a cavity-manufacturing process according to an embodiment of the present invention.

FIG. 4 illustrates exemplary stages 10 of manufacture corresponding to a cavity-manufacturing process according to an embodiment of the present invention. The exemplary stages 10 correspond to processing steps performed on a PCB substrate 12 and illustrate insertion of a second PCB 26 into the manufacturing process as discussed more fully below.

Figure 5:
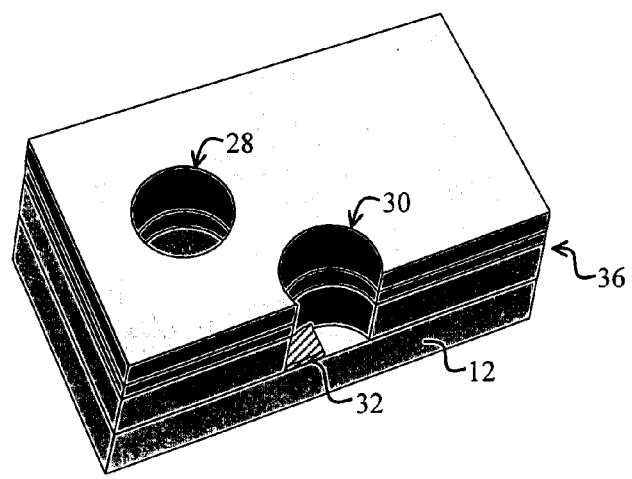
FIG. 5 illustrates plural microcavities according to an embodiment of the present invention employing stacked PCB substrates with cavity holes therein.

FIG. 5 illustrates a microcavities 28, 30 according to an embodiment of the present invention. The microcavities 28, 30 are formed in a microcavity structure implemented via stacked PCB substrates 36 with cavity holes 28, 30 therein. FIG. 5 illustrates the ability to bond multiple PCB substrates 36 to form high-aspect-ratio cavities 28, 30 and structures via cavity-manufacturing processes implemented according to embodiments of the present invention. By employing various substrates with perforations of different sizes and/or shapes; by employing perforations that are strategically offset from each other, and so on, various shapes, sizes, and orientations of cavities may be developed. For example, a cavity with triangular vertical cross section may be formed by successively reducing or enlarging the dimensions of the perforations in each layer.

Figure 6:
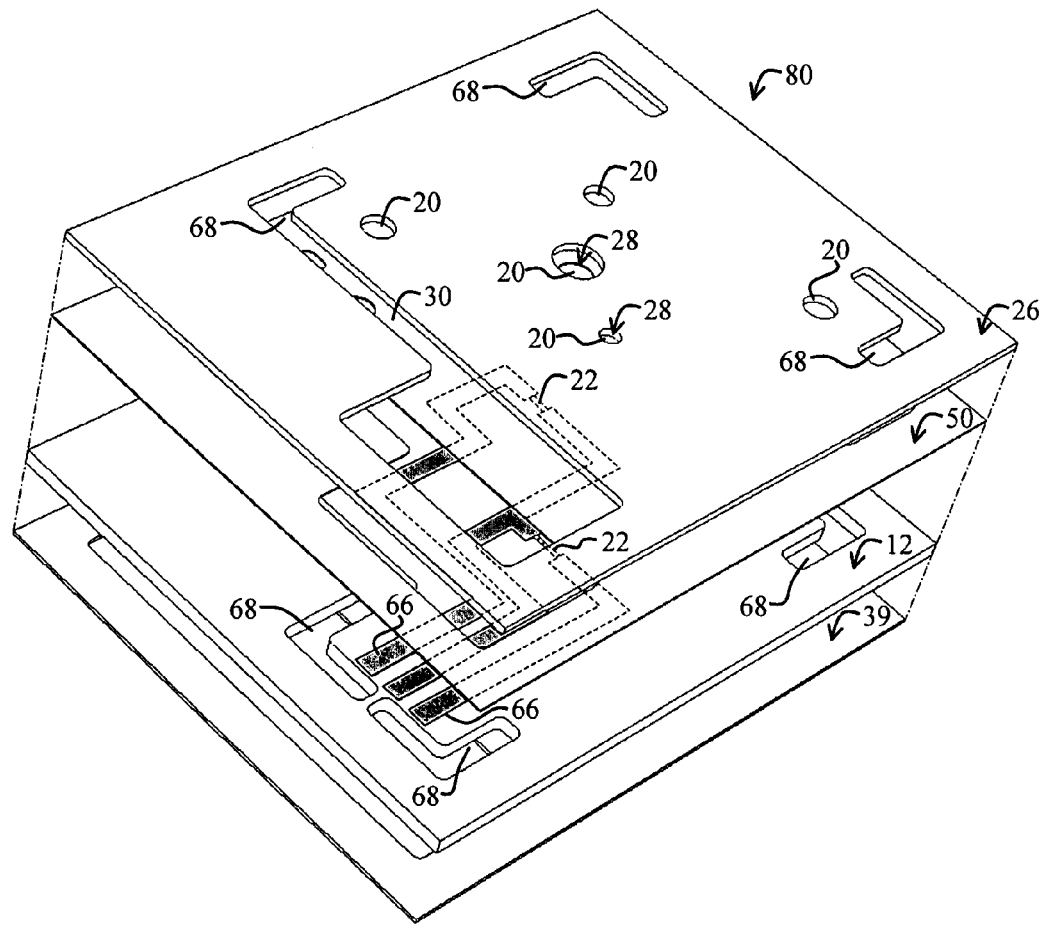
FIG. 6 illustrates multiple layers employed in one embodiment of the present invention to create selectively positioned electrically controllable microcavity initiators.

FIG. 6 illustrates multiple layers 26, 50, 12, 39 employed in one embodiment of the present invention to create selectively positioned electrically controllable microcavity initiators 28 in a cavity assembly 80. FIG. 6 is a three-dimensional Computer-Aided Design (CAD) drawing of a more complex cavity assembly 80 using novel processes disclosed herein. The bridgewires 22 may be replaced with other devices, such as reactive bridges, laser diodes, and so on, without departing from the scope of the present invention.

Figure 7:
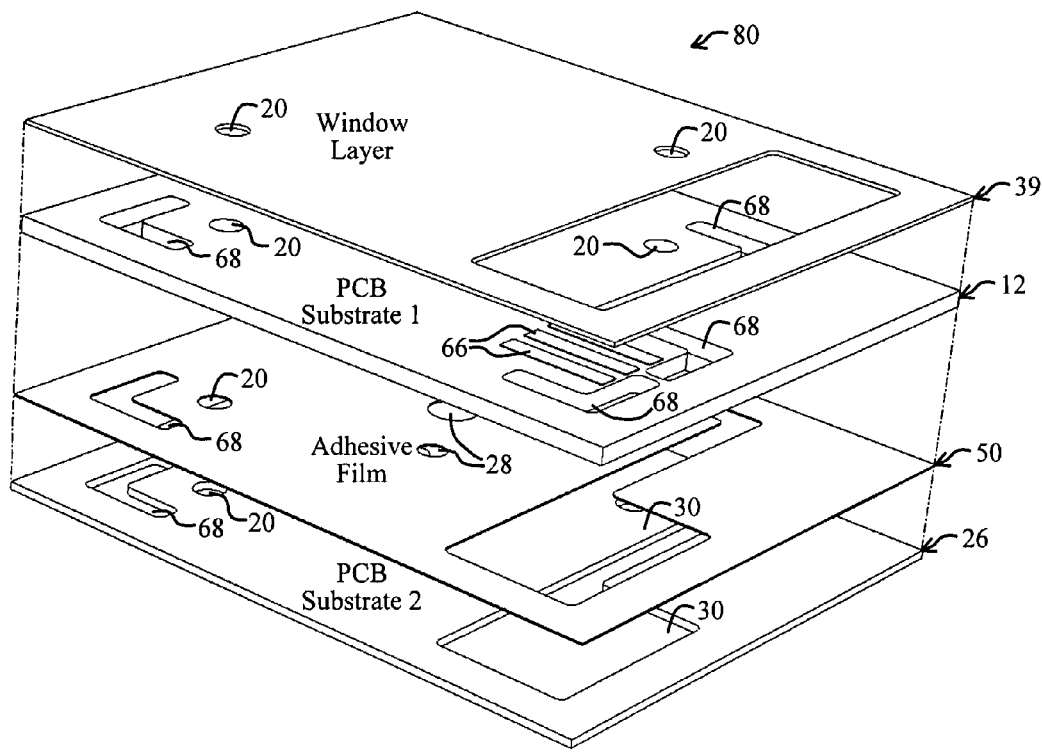
FIG. 7 is an upside down view of the embodiment of FIG. 6.

FIG. 7 is an upside down view of the embodiment 80 of FIG. 6.

Figure 8:
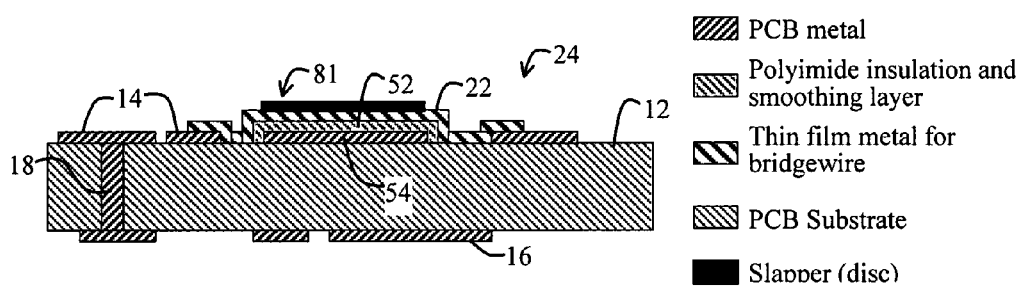
FIG. 8 is a cross-sectional view of a bottom layer of an electrically controllable microcavity according to an embodiment of the present invention that is adapted for use with insensitive energetic materials.

FIG. 8 is a cross-sectional view of a bottom layer 12 of an electrically controllable microcavity according to an embodiment of the present invention that is adapted for use with insensitive energetic materials. FIG. 8 illustrates incorporation of a relatively hard backplate surface 54, which may be implemented via a copper pad, to better reflect shock waves, such as shock waves resulting from over 500 Volts passing through the bridgewire 22. The process used to implement the structure 24 associated with FIG. 8 may include using PCB copper pads 54 to create a stiffer surface beneath the bridgewire 22. Note that the bridgewire 22 is insulated from this copper pad 54 via the dielectric film 52.

The dielectric film 52 may act as a smoothing layer. The smoothing layer 52 may be made by spin coating and curing a polymer on the surface of the structure 24. The resulting spun layer may be patterned and etched as needed via lithography. For the purposes of the present discussion, lithography may be any process that involves use of masks, photoresist, and application electromagnetic energy, such as light, to selectively create features, such as patterns, in a material. Note that the copper pad 54 may be omitted without departing from the scope of the present invention.

FIG. 4 illustrates a wafer-scale batch process used to create integrated microcavity initiators via PCB substrates. FIG. 4 shows a first illustrative process flow 10, which includes various steps. First, a PCB panel 12 is manufactured with the appropriate traces 14, 16, vias 18 (see step 1 of FIG. 4), and holes 20 (i.e., physically openings—see step 3 of FIG. 4).

Chromium or titanium and gold 14-18 are deposited and patterned with specific resistor designs 22, as shown in step 2 of FIG. 4. An alternative exemplary resistor design 24 is shown in FIG. 8. The metal patterning techniques include lift-off techniques, where photoresist is applied and patterned first before metal deposition. Other metals, such as titanium, Ni/Chrome alloys, tungsten, and so on, can also be used. The bridgewire 22, also called a bridgewire resistor, is created with thin film deposition and patterning techniques, carefully making sure that the high-resolution bridgewire 22 makes proper contact with the pre-processed metal traces 14-18 on the PCB 12. Additional through-holes are drilled in the PCB 12 in a third step.

Subsequently, in a fourth step, a second PCB substrate 26 is aligned and bonded with the first PCB substrate 12 (See step 4 of FIG. 4) via a bonding gasket 50. The bonding gasket 50 may be implemented via a B-stage adhesive. This second substrate 26, also called a wafer, contains routed holes or perforations 20 to create cavities 28 to accommodate energetic material. The substrate 26 may contain other openings, such as the openings for the cavities 30 of FIG. 3, for additional electrical contacts (shown as contacts 32 of FIGS. 3 and 5) and alignment/positioning holes (shown as holes 20 of FIG. 1) used during assembly. The depth of the cavities 28 is easily varied by selectively changing the thickness of the second PCB wafer 26. The various cavities 28, 30 of FIGS. 3 and 4 may be made using the PCB-industry drilling processes.

Using the sequence of steps 10 shown in FIG. 4 and discussed herein, multiple PCB wafers (shown as multiple bonded wafers 36 in FIG. 5) with appropriate holes 20 can be bonded to create varied stepped cavities with different depths and diameters for any energetic firing train. An energetic firing train may include different layers of energetics to enable consistent initiation of a tertiary explosive or propellant. Vertical sidewalls of the holes 20 may be used as a supporting wall for an energetic train (not shown) included therein.

The bonding of the first PCB substrate 12 with the second substrate 26 of FIG. 4 or the stacked substrates 36 of FIG. 5 may be performed via various processes, including via glue, such as epoxy, and/or the bonding gasket 50. A thin layer of glue may be spun or sprayed on one or more surfaces of the substrates to facilitate bonding.

With this baseline structure as illustrated in step 4 of FIG. 4, more layers can be added, such as a Mylar film 39, as shown in step 5 of FIG. 4. The mylar film 39 provides viewing windows 40-42 that enable one to see things of interest 44, 46, such as a bridgewire 44 or the status of a safety lock and another thing of interest 46. The additional thing of interest 46 may include firing-train mechanisms, arming devices, other circuits, and so on, that are positioned on a side of the second substrate 26 that is opposite the first substrate 12. Note that the viewing windows 40-42 that are made from the Mylar film 39 may be implemented via another type of transparent or partially transparent film, such as acrylic or polyester film. In one embodiment, the Mylar film 39 includes a pressure-sensitive adhesive for bonding to substrates.

With reference to FIGS. 4 and 6, the second substrate 26 acts as a cavity layer. The cavity layer is bonded to the first substrate 12, which acts as a circuit layer. The cavity layer 26 is bonded to the circuit layer 12 via a bonding gasket 50, as shown in FIG. 6. For the purposes of the present discussion, a bonding gasket may be any initially solid material formed in a desired shape and/or size and usable to join, glue, or otherwise attach objects or things to other objects or things.

In the present specific embodiment, the bonding gasket 50 is a so-called B-stage adhesive gasket. For the purposes of the present discussion, a B-stage adhesive may be any adhesive that can be selectively activated, such as via predetermined heat, Ultra Violet (UV) radiation, or other mechanisms. Once activated, the B-stage adhesive bonds accompanying parts. For example, certain B-stage adhesives become tacky and then harden and cure after a predetermined time interval or exposure to heat, UV radiation, or other energy.

B-staging may refer to a process wherein an adhesive is activated to allow for staging, i.e., the bonding of components. Use of B-stage adhesives, such as UV B-Stage Adhesive 966A by 3M, may exhibit plural benefits beyond other traditional bonding techniques when used with embodiments of the present invention. Conventional epoxy liquid glues may wick to undesired regions of the accompanying circuit or substrates. Furthermore, such conventional glues often must be applied soon after application, which may create manufacturing bottlenecks. Use of the B-stage adhesive facilitates parts assembly and may increase production yield by facilitating parts assembly and minimizing manufacturing errors and bottlenecks.

The mylar film 39 may represent a see-through layer for visual inspection of safe or armed status of associated devices, such as the safe or armed status of an inertial safing mechanism (See thing of interest 46 of FIG. 4).

The second layer 26 has perforations 20 therein that open over the bridgewires 22 positioned on the second layer 12. Various cutting methods, such as laser, Computer Numerical Control (CNC) machining methods, and die-cutting methods may be employed to form holes in various substrates and layers as needed to meet the needs of a given implementation of an embodiment of the present invention.

The second layer 26 may be implemented via various materials, such as PCB boards or polyimide sheets. Circuits may be implemented via various methods, including thin-film and PCB circuit-forming methods.

With reference to FIG. 8, a special resistor design 24 is shown implemented on the first substrate 12. The resistor design 24 includes an insulator 52 with a bridgewire 22 disposed thereon. Energetic material may be disposed on top of the bridgewire 22. A backplate 54 may enhance the resulting shock wave produced via a cavity that is formed over the resistor design 24 via a perforation in a second substrate, such as the substrate 26 of FIG. 6. The resistor design 24 is particularly effective in initiating insensitive energetic materials, which may require high voltage pulses.

Certain embodiments of the present invention afford the ability to create these cavity-heater structures directly on top of PCBs already populated with traces, capacitors, transformers, etc; thereby eliminating external firing circuitry and packaging (labor/materials) that would be required with conventional bridge-wire initiator assemblies. Nanosecond multipoint initiation techniques become much easier to implement in this form factor.

A cavity-filling step involves loading a micro-cavity with a suitable propellant or other energetic material. Suitable energetic-loading techniques include inkjet-type spraying techniques and the common mechanical press method.

A passivation step may be included for certain applications. The passivation step includes covering an integrated cavity with a thin polymer membrane, thereby encasing and preserving the energetic material. An example of such a film that may be used for this sealing function is Parylene, which is deposited as a low temperature vapor process (thereby ensuring safe deposition over energetic materials).

While the present embodiments are discussed with respect to PCB boards, other types of boards and substrates may be employed without departing from the scope of the present invention.

While specific layers 12, 39, 26, 50 are shown in various embodiments, such as the embodiment shown in FIG. 6, more or fewer layers may be employed without departing from the scope of the present invention. The exact number and type of layers employed is application-specific and may be readily altered by those skilled in the art to meet the needs of a given application.

Firing the energetic material in the microcavity, such as the microcavity 28 of FIG. 6, is accomplished by input current into metal pads external to the cavity. The total energy required to initiate the charge depends on the sensitivity of the energetic material, the bridgewire resistance, thermal conductivity of the substrate or insulation, and the input power circuit. Our results range from 142 uJ to 2000 uJ with 10V and nominal 2-6 ohm heater resistance. Energetic materials that have been tested are lead styphnate, CL-20, household matchstick slurry, black powder and thermites. Insensitive Munitions (IM) can be initiated with a thicker copper bridge layer (1-10 um) and a 500+ Volt pulse. Furthermore, for insensitive materials that require a much stiffer substrate for the initiator (to reflect shock wave upwards), the native copper cladding 54 on the PCB can be used, as shown in FIG. 8. Alternatively, a stronger substrate material, such as a polyimide PCB may also be used. A slapper 81, which may be implemented via a Parylene, SU-8, polyimide disk, can also be employed. The slapper 81 may be used with a spacer ring, which may be made from relatively thick SU-8 or Mylar, to facilitate initiating an IM.

In this embodiment, the PCB copper 54 acts as a stiffer material than the fiberglass of the PCB 12, and a pad of thick polyimide 52 acts as the dielectric that prevents shorting of the thin film plated bridge 22 to the PCB copper 54. The PCB copper pad 54 may be implemented with another material, such as a stiffer metal, without departing from the scope of the present invention.

Conventional methods involving use of brittle, rigid silicon substrates, which must be individually manufactured, diced, and picked and placed into desired positions of a circuit exhibit significant shortcomings, such as excessive costs and lack of versatility, which are addressed by various embodiments herein. Microcavities constructed in accordance with embodiments of the present invention exhibit plural advantages over conventional microcavities, including price and versatility advantages. Furthermore, accompanying methods for constructing microcavities and related initiators according to embodiments of the present invention also yield significant advantages.

Advantages may include: (a) suitability for use with batch processing schemes, wherein several devices are manufactured simultaneously on one wafer, thereby enabling reducing manufacturing costs and reducing quality assurance costs (b) smaller device are more easily created with lower weights and volumes (d) increased device performance repeatability, thereby enabling devices with digital control.

Conventional devices typically employ a semiconductor bridge-wire, which is often used in automobile air-bag initiators, without any other surrounding structure to focus the energy. Nor do they typically demonstrate a compatible process by which their bridgewires or heaters can be insulated from the substrate.

Other inventors purportedly have claimed semiconductor processes for fabricating initiators but have apparently not taught, disclosed, suggested, or anticipated the use of multiple printed circuit board layers or other types of layers to construct three dimensional energetic cavities as disclosed herein. Instead, previous approaches typically require use of silicon wells, which are often shallow and more complex to fabricate than the PCB cavity designs discussed herein. Lastly, the fabrication processes of conventional initiators and their associated packaging (casings) are relatively incompatible with post-PCB processing. Hence, drawbacks of conventional microcavity initiators and methods of making same are addressed and improved upon in embodiments presented herein.

One embodiment of the invention comprises a method for creating one or more electrically controllable microcavities. The method includes forming a circuit on a first substrate; selectively modifying a second substrate; and then placing the second substrate on the first substrate so that modifications to the second substrate coincide with desired sections of the first substrate based on the circuit.

The modifications to the second substrate include holes therethrough and/or indentations therein. The circuit includes bridgewires, which may include thin-film bridgewires.

The step of placing further includes bonding the first substrate to the second substrate. The step of bonding includes employing a bonding gasket between the second substrate and the first substrate, wherein the bonding gasket exhibits perforations therein that coincide with the holes and/or indentations in the second substrate and the one or more bridgewires. The step of placing further includes positioning the second substrate so that the holes therethrough coincide with the bridgewires in the circuit.

In a more specific embodiment, the first substrate includes a preprinted Printed Circuit Board (PCB). The second substrate includes selectively perforated blank PCB substrate. The cavities accommodate energetic material and implement one or more microcavity initiators.

The modifications to the second substrate include a window, such as a Mylar window, therein. The Mylar window is positioned in the second substrate so that when the second substrate is placed on the first substrate, that the window enables viewing of a desired portion of the circuit. The Mylar window is positioned in the second substrate so that when the second substrate is placed on the first substrate, that the window enables viewing of a thing through the first substrate, the thing being located behind the second substrate.

The modifications further include selectively placed cutting guides in the second substrate so that when the first substrate and the second substrate are cut based on the cutting guides that the first substrate and the second substrate form plural microcavity initiator chips. The cutting guides exhibit predetermined shapes so that the plural microcavity initiator chips exhibit desired shapes.

Figure 9:
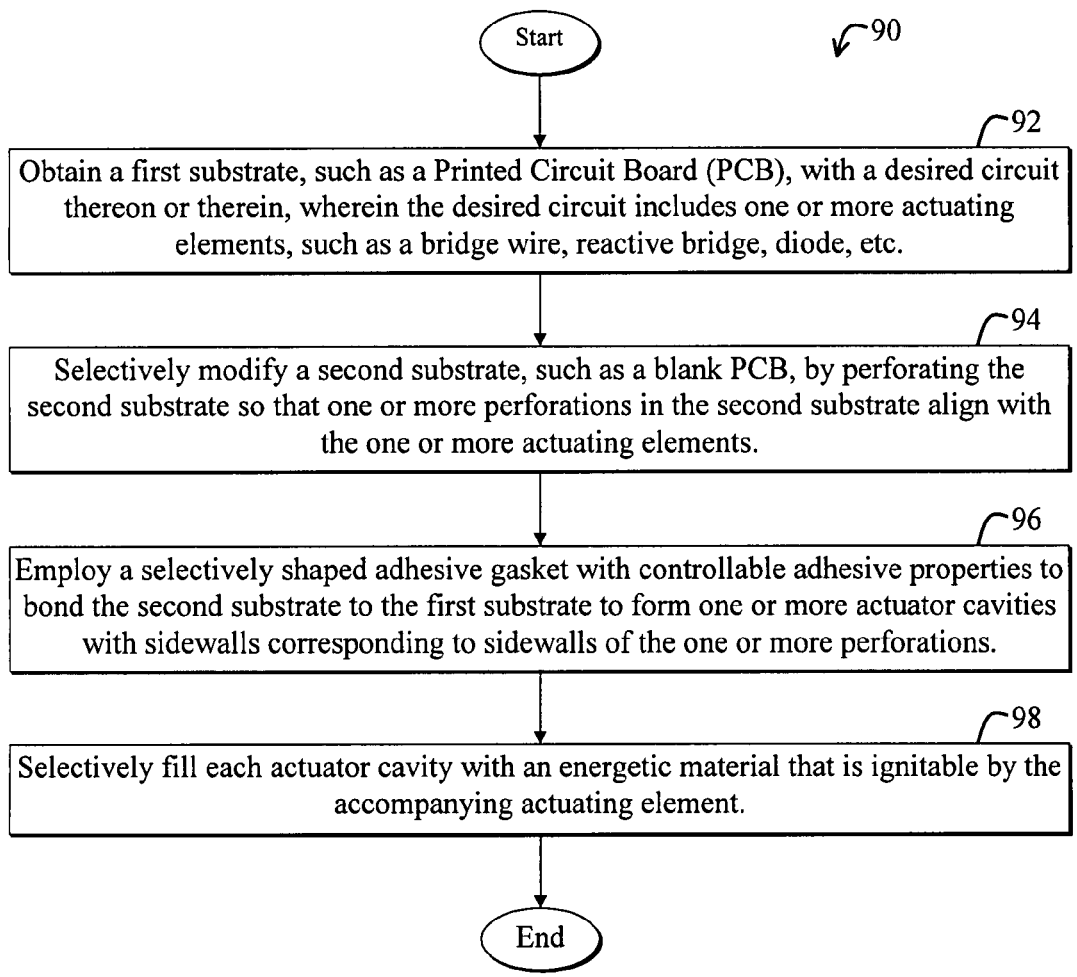
FIG. 9 is a flow diagram of a method for creating a cavity actuator according to an embodiment of the present invention.

FIG. 9 is a flow diagram of a method 90 for creating a cavity actuator according to an embodiment of the present invention. The method 90 includes a first step 92 wherein a first substrate, such as a Printed Circuit Board (PCB), is obtained. A desired circuit is formed on or in the first substrate and includes one or more actuating elements, such as a bridgewire, reactive bridge, diode, etc.

A second step 94 includes selectively modifying a second substrate, such as a blank PCB without metalization. The second substrate is perforated so that one or more perforations in the second substrate coincide with the one or more actuating elements when the first substrate is aligned with the second substrate.

A third step 96 includes employing a selectively shaped adhesive gasket with controllable adhesive properties to bond the second substrate to the first substrate. The adhesive gasket, which may be implemented via a B-stage gasket, has apertures or holes that are positioned to coincide with the perforations in the second substrate and the actuating elements on or in the first substrate when the gasket is aligned with the first and second substrates. The gasket is employed to bond the first and second substrates to form one or more actuator cavities with sidewalls corresponding to sidewalls of the one or more perforations of the second substrate.

Subsequently, a fourth step 98 includes selectively filling each actuator cavity with an energetic material that is ignitable by the accompanying actuating element.

Various steps 92-98 of the method may be interchanged and/or modified without departing from the scope of the present invention. For example, the second substrate may be modified before the circuit is printed on the first substrate.

Furthermore, additional steps may be employed. For example, a step wherein a polymer smoothing layer is strategically patterned on the first substrate so that one or more bridgewires to be added to the first substrate overlay the polymer smoothing layer may be employed. An additional step involving using thin-film techniques to deposit one or more thin-film bridgewires on the first substrate may also be included. As another example, a step involving determining the proper alloy to use for a thin-film bridgewire based on the smoothness properties of the polymer smoothing layer and the desired energy output by the bridgewire may be included.

Furthermore, the method 90 may be replaced with a more general method without departing from the scope of the present invention. An exemplary general method involves obtaining a Printed Circuit Board (PCB) with a circuit printed thereon; selectively adding a smoothing layer to one or more desired portions of the PCB; connecting a bridgewire to the circuit so that the bridgewire extends across the smoothing layer; creating a hole in a second layer of material; and coupling the second layer of material to the circuit board so that a portion of the bridgewire is approximately aligned with the hole and so that the PCB substantially covers one end of the hole.

Another exemplary method involves coating a predetermined region of a circuit board with a smoothing material, wherein the smoothing material is characterized by a predetermined roughness; determining desired dimensions and composition of a bridgewire based on the predetermined roughness so that the bridgewire outputs desired energy in response to application of a certain signal to the bridgewire; and disposing the bridgewire on the smoothing material, wherein the bridgewire has approximately the desired dimensions and composition.

Exact materials and dimensions of various components employed to implement embodiments of the present invention are application specific. For example, PCBs made from various types of epoxy, polyester, polyimides, or other materials may be employed. Cavities with dimensions on the order of nanometers or smaller may be possible depending on the substrates used. Similarly, cavities with dimensions on the order of millimeters of larger are possible.

While embodiments generally described herein have cylindrical cavities, various shapes are possible. For example, parabolic, triangular, rectangular, stepped cavities, and so on may be implemented via embodiments of the present invention.

Figure 10:
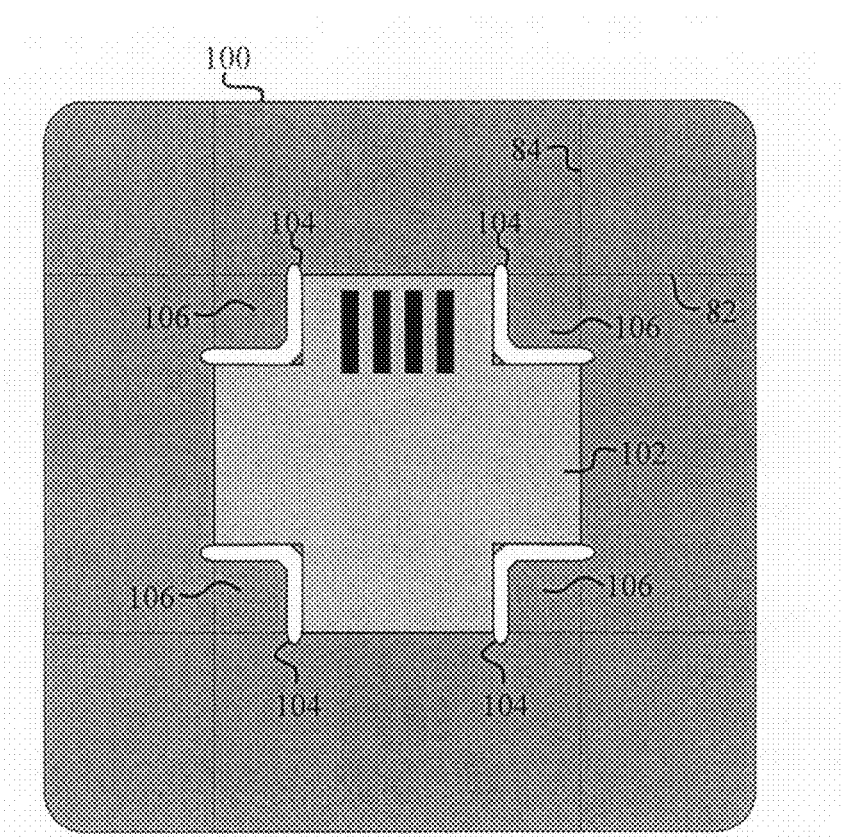
FIG. 10 is a diagram illustrating use of strategically shaped slots to obtain a plus-shaped chip according to an embodiment of the present invention.

Furthermore, while the chips and substrates shown herein are substantially square or rectangular, other shapes and sizes of chips with accompanying cavities are possible. For example, FIG. 10 is a diagram illustrating use of strategically shaped concave slots 104 to obtain a plus-shaped chip 102 according to an embodiment of the present invention. The concave slots 104 are cut, such as via CNC cutting tools, in substrate materials 100. The concave slots 104 are positioned and shaped so that the substrate materials 100 are cut along the horizontal axis 82 and vertical axis 84, the resulting chip 102 will be missing corner sections 106. This results in a plus-shaped chip 102 with concave features corresponding to the missing corner sections 106. For the purposes of the present discussion, a concave feature may be any feature, such as a cutout, that extends inward from an outside boundary of an object.

Hence, embodiments of the present invention are not limited to a given shape of a chip. Furthermore, embodiments of the present invention are not limited to cavity actuators, such as inertial igniters, relying upon combustion of energetic materials. For example, a cavity constructed according to an embodiment of the present invention may be coated with reflective material and act as a waveguide for a laser diode embedded in the cavity.

Although the invention has been discussed with respect to specific embodiments thereof, these embodiments are merely illustrative, and not restrictive, of the invention. Embodiments of the present invention can operate between any two processes or entities including users, devices, functional systems or combinations of hardware and software.

In the description herein, numerous specific details are provided, such as examples of components and/or methods, to provide a thorough understanding of embodiments of the present invention. One skilled in the relevant art will recognize, however, that an embodiment of the invention can be practiced without one or more of the specific details, or with other apparatus, systems, assemblies, methods, components, materials, parts, and/or the like. In other instances, well-known structures, materials, or operations are not specifically shown or described in detail to avoid obscuring aspects of embodiments of the present invention.

Reference throughout this specification to "one embodiment", "an embodiment", or "a specific embodiment" means that a particular feature, structure, or characteristic described in connection with the embodiment is included in at least one embodiment of the present invention and not necessarily in all embodiments. Thus, respective appearances of the phrases "in one embodiment", "in an embodiment", or "in a specific embodiment" in various places throughout this specification are not necessarily referring to the same embodiment. Furthermore, the particular features, structures, or characteristics of any specific embodiment of the present invention may be combined in any suitable manner with one or more other embodiments. It is to be understood that other variations and modifications of the embodiments of the present invention described and illustrated herein are possible in light of the teachings herein and are to be considered as part of the spirit and scope of the present invention.

It will also be appreciated that one or more of the elements depicted in the drawings/figures can also be implemented in a more separated or integrated manner, or even removed or rendered as inoperable in certain cases, as is useful in accordance with a particular application. It is also within the spirit and scope of the present invention to implement a program or code that can be stored in a machine-readable medium to permit a computer to perform any of the methods described above.

Additionally, any signal arrows in the drawings/figures should be considered only as exemplary, and not limiting, unless otherwise specifically noted. Furthermore, the term "or" as used herein is generally intended to mean "and/or" unless otherwise indicated. Combinations of components or steps will also be considered as being noted, where terminology is foreseen as rendering the ability to separate or combine is unclear.

As used in the description herein and throughout the claims that follow "a", "an", and "the" include plural references unless the context clearly dictates otherwise. Furthermore, as used in the description herein and throughout the claims that follow, the meaning of "in" includes "in" and "on" unless the context clearly dictates otherwise.

The foregoing description of illustrated embodiments of the present invention, including what is described in the Abstract, is not intended to be exhaustive or to limit the invention to the precise forms disclosed herein. While specific embodiments of, and examples for, the invention are described herein for illustrative purposes only, various equivalent modifications are possible within the spirit and scope of the present invention, as those skilled in the relevant art will recognize and appreciate. As indicated, these modifications may be made to the present invention in light of the foregoing description of illustrated embodiments of the present invention and are to be included within the spirit and scope of the present invention.

Thus, while the present invention has been described herein with reference to particular embodiments thereof, a latitude of modification, various changes and substitutions are intended in the foregoing disclosures, and it will be appreciated that in some instances, some features of embodiments of the invention will be employed without a corresponding use of other features without departing from the scope and spirit of the invention as set forth. Therefore, many modifications may be made to adapt a particular situation or material to the essential scope and spirit of the present invention. It is intended that the invention not be limited to the particular terms used in following claims and/or to the particular embodiment disclosed as the best mode contemplated for carrying out this invention, but that the invention will include any and all embodiments and equivalents falling within the scope of the appended claims.

Thus, the present invention has been described herein with reference to a particular embodiment for a particular application. Those having ordinary skill in the art and access to the present teachings will recognize additional modifications, applications, and embodiments within the scope thereof.

It is therefore intended by the appended claims to cover any and all such applications, modifications and embodiments within the scope of the present invention.

Accordingly,

What is claimed is:

1. A microcavity structure comprising:
   a first substrate layer having one or more actuators;
   a second substrate layer comprising stacked Printed Circuit Board (PCB) layers, each stacked PCB layer includes one or more micro sized perforations, wherein the one or more micro sized perforations of each PCB layer are aligned to form one or more microcavities through the second substrate layer;
   energetic material filling each of the one or more microcavities; and
   a bonding gasket that bonds the first substrate layer to the second substrate layer, wherein the one or more actuators are aligned with the one or more microcavities and configured to ignite the energetic material.

2. The microcavity structure of claim 1, wherein the first substrate layer is a PCB layer.

3. The microcavity structure of claim 2, wherein the one or more actuators are directly contacting the energetic material.

4. The microcavity structure of claim 3, wherein the one or more actuators include a bridgewire.

5. The microcavity structure of claim 4, further including a smoothing layer between the bridgewire and the PCB layer of the first substrate layer.

6. The microcavity structure of claim 1, including a plurality of actuators and a plurality of microcavities.

* * * * *